United States Patent
Letavic et al.

(10) Patent No.: US 6,627,958 B2
(45) Date of Patent: Sep. 30, 2003

(54) LATERAL HIGH VOLTAGE SEMICONDUCTOR DEVICE HAVING A SENSE TERMINAL AND METHOD FOR SENSING A DRAIN VOLTAGE OF THE SAME

(75) Inventors: Theodore J. Letavic, Putnam Valley, NY (US); John Petruzzello, Carmel, NY (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/015,641

(22) Filed: Dec. 10, 2001

(65) Prior Publication Data

US 2003/0107086 A1 Jun. 12, 2003

(51) Int. Cl.[7] .......................... H01L 29/78; H01L 27/01
(52) U.S. Cl. ....................................... 257/367; 257/347
(58) Field of Search ................................. 257/347, 367

(56) References Cited

U.S. PATENT DOCUMENTS

| 5,246,870 A | 9/1993 | Merchant |
| 5,300,448 A | 4/1994 | Merchant et al. |
| 5,969,387 A | 10/1999 | Letavic et al. |
| 5,973,341 A | * 10/1999 | Letavic et al. ............... 257/287 |
| 6,221,737 B1 | 4/2001 | Letavic et al. |
| 6,232,636 B1 | 5/2001 | Simpson et al. |
| 6,404,015 B2 | * 6/2002 | Emmerik et al. ........... 257/348 |

FOREIGN PATENT DOCUMENTS

| JP | 11150273 A | * 6/1999 | ......... H01L/29/786 |
| KR | 2001094722 A | * 11/2001 | ........... H01L/29/78 |

* cited by examiner

*Primary Examiner*—Allan R. Wilson
(74) *Attorney, Agent, or Firm*—Steven R. Biren

(57) ABSTRACT

A lateral high voltage semiconductor device having a sense terminal and a method for sensing a drain voltage of the same are provided. Specifically, the present invention relates to a thin layer, high voltage, lateral silicon-on-insulator (SOI) device having a field plate terminal that is disconnected from a source terminal. By measuring voltage or current on the separate field plate terminal, the drain voltage of the device can be sensed. This sensing capability is a protection scheme against overstress voltage conditions.

20 Claims, 3 Drawing Sheets

LATERAL HIGH VOLTAGE SEMICONDUCTOR DEVICE HAVING A SENSE TERMINAL AND METHOD FOR SENSING A DRAIN VOLTAGE OF THE SAME

BACKGROUND OF THE INVENTION

1. Field of the Invention

The present invention generally relates to a lateral high voltage semiconductor device having an internal sense terminal and a method for sensing a drain voltage of the same. More particularly, the present invention relates to a thin layer, high voltage lateral silicon-on-insulator (SOI) device having a field plate terminal disconnected from a source terminal for the purpose of sensing a drain voltage.

2. Background Art

In the production of electronic consumer devices such as televisions, personal computers and the like, thin layer, high voltage, lateral silicon-on-insulator (SOI) semiconductor devices are often implemented. Such high voltage devices, however, are well known to be subject to a voltage overstress during transient conditions (e.g., switching). Since, the overstress voltage is often higher than the avalanche breakdown voltage, exceedingly high voltage and high current flow in the device often results. The capability of a device to sink this overstress energy is quantified as a "ruggedness specification."

For a lateral SOI device, the inherent ruggedness does not match that of vertical devices due to thermal limitations. Accordingly, a protection scheme is required. Various protection schemes can be used to improve the inherent ruggedness of semiconductor devices. For lateral SOI devices, protection schemes that avoid avalanche breakdown and associated current flow are important for a wide class of switch mode power supply (SMPS) applications.

Heretofore, attempts have been made to provide such a protection scheme. No existing scheme, however, provides an efficient way to sense drain voltage on an SOI lateral device based upon a voltage on a field plate. In contrast, conventional devices are provided with a field plate that is shorted to the source terminal/contact. As such, the field plate is not a separate terminal on which a voltage or current can be measured. Accordingly, such devices are not provided with an adequate internal protection scheme that affords the opportunity to make adjustments to avoid overstress voltage conditions.

In view of the foregoing, there exists a need for a scheme and method for sensing a drain voltage of a thin layer, high voltage, lateral SOI semiconductor device so that ample opportunity is provided to avoid overstress voltage conditions. Moreover, there exists a need for such a device that has a separate terminal for sensing drain voltage.

SUMMARY OF THE INVENTION

The present invention overcomes the drawbacks of existing schemes by provide a lateral semiconductor device having a sense terminal/electrode. Specifically, the present invention provides a lateral semiconductor device that has a field plate terminal disconnected from a source terminal for sensing a drain voltage of the device. Thus, the device of the present invention typically has at least five disconnected terminals: (1) a source terminal; (2) a gate terminal; (3) a drain terminal; (4) a substrate terminal; and (5) a field plate terminal. Under the present invention, the drain to field plate capacitance has a monotonic variation with voltage. This can be used to sense the drain voltage of the device through displacement current flow or voltage during a switching transient with a high degree of accuracy. In particular, by measuring the field plate voltage or current during a switching transient, the drain voltage can be accurately calculated. This provides the opportunity to make adjustments to avoid overstress voltage conditions.

According to a first aspect of the present invention, a lateral high voltage semiconductor device having a sense terminal is provided. The device comprises: (1) a buried oxide layer formed over a substrate; (2) a silicon layer formed over the buried oxide layer; (3) a top oxide layer formed over the silicon layer; and (4) a field plate terminal formed over the top oxide layer, wherein the field plate terminal is disconnected from a source terminal to sense a drain voltage of the device.

According to a second aspect of the present invention, a lateral high voltage semiconductor device having a sense terminal is provided. The device comprises: (1) a source terminal formed over a silicon layer; (2) a gate terminal formed over a top oxide layer; (3) a drain terminal formed over the silicon layer; (4) a substrate terminal formed on a substrate; and (5) a field plate terminal formed over the top oxide layer, wherein the field plate terminal is disconnected from the source terminal to sense a drain voltage of the device.

According to a third aspect of the present invention, a method for sensing a drain voltage of a lateral high voltage semiconductor device is provided. The method comprises: (1) forming a lateral high voltage silicon-on-insulator device having a field plate terminal disconnected from a source terminal; and (2) sensing the drain voltage by measuring a field plate voltage of the device.

Therefore, the present provides a device and method for sensing a drain voltage of a thin layer, high voltage, lateral SOI device.

BRIEF DESCRIPTION OF THE DRAWINGS

These and other features of this invention will be more readily understood from the following detailed description of the various aspects of the invention taken in conjunction with the accompanying drawings in which.

Figure 1:
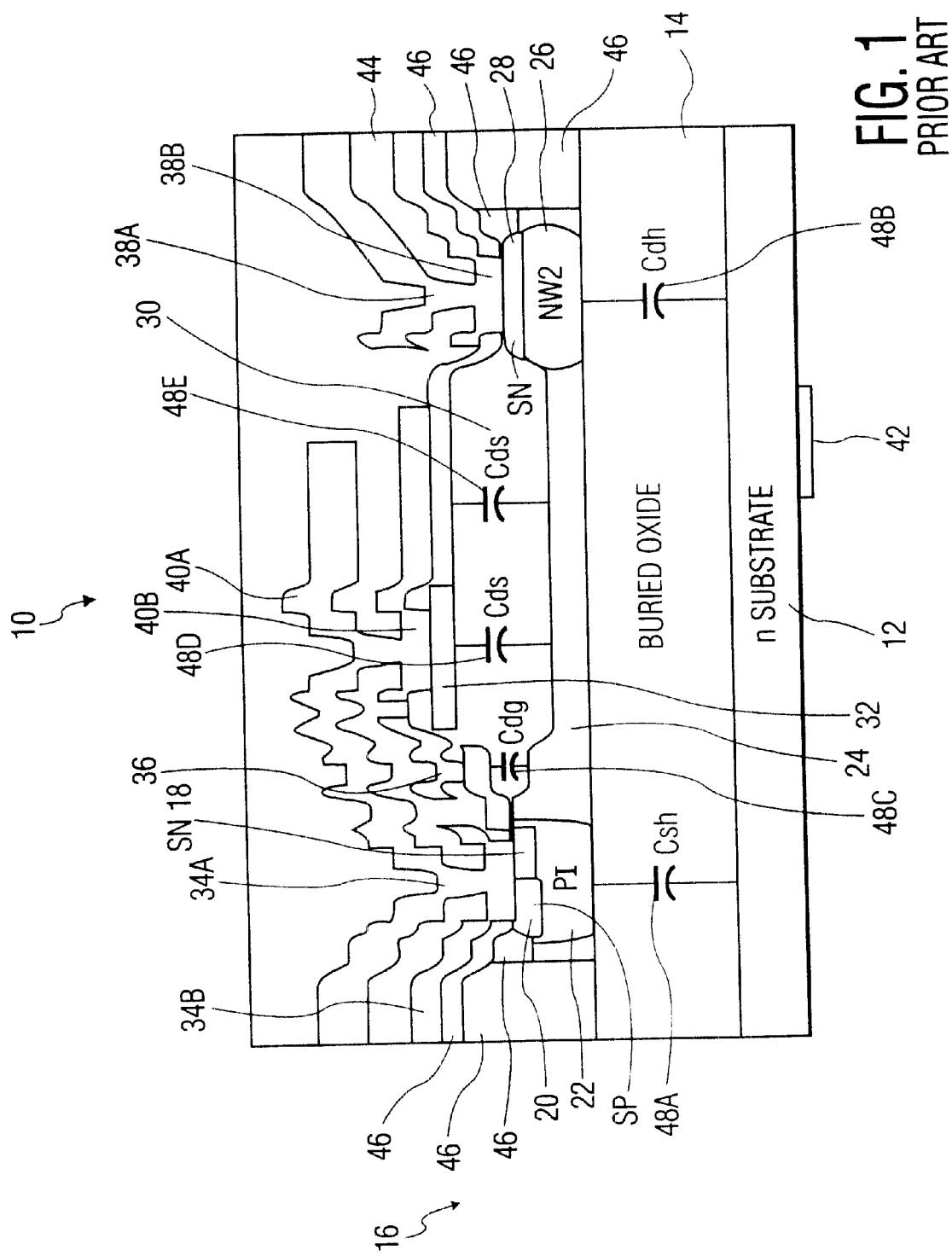
FIG. 1 depicts a cross-sectional view of a related art semiconductor device.

The drawings are merely schematic representations, not intended to portray specific parameters of the invention. The drawings are intended to depict only typical embodiments of the invention, and therefore should not be considered as limiting the scope of the invention. In the drawings, like numbering represents like elements.

DETAILED DESCRIPTION OF THE INVENTION

In general, the present invention provides a thin layer, high voltage, lateral silicon-on-insulator (SOI) device having an isolated sense terminal/electrode. Specifically, the present invention provides a lateral semiconductor device having a field plate terminal that is disconnected from a source terminal. The separate field plate terminal allows the drain voltage of the device to be sensed based upon a measured current or voltage on the field plate terminal. The present invention is useful, for example, as a protection scheme in 500V and 800V switch-mode power supplies (SMPS) for consumer goods (television, PC, etc.).

Referring now to FIG. 1, a related art SOI device 10 is depicted. As shown device 10 generally includes: (1) substrate/handle wafer 12; (2) buried oxide layer 14; (3) silicon layer 16 having N+source region 18, P+source region 20, P-inversion or body region 22, drift region 24, n-well-2 region 26, and N+drain region 28; (4) top oxide layer 30; (5) polysilicon layers 32; (6) source terminal 34A–B; (7) gate terminal 36; (8) drain terminal 38A–B; (9) field plate 40A–B; (10) substrate terminal 42; (11) nitride layer 44; (12) oxide regions 46; (13) source to substrate capacitor 48A; (14) drain to substrate capacitor 48B; (15) drain to gate capacitor 48C; and (16) drain to source capacitors 48D–E.

Device 10 is an LDMOS structure with low gate to drain capacitance, which is generally used to optimize for switching losses. As depicted, device 10 is a double metal structure with the source terminal 34A–B, field plate 40A–B, and drain terminal 38A–B being formed with concentric metal layers (A and B). Moreover, device 10 has four terminals, namely, source terminal 34A–B, gate terminal 36, drain terminal 38A–B, and substrate terminal 42. As shown, field plate 40A is shorted to source terminal 34A, and as such, is not a terminal. Although the shorting of field plate 40A to source terminal 34A provides improved voltage handling, it does not provide an additional isolated terminal that could be used to implement an internal protection scheme.

Under the present invention, device 10 can be modified to allow for drain voltage to be sensed. Specifically, under the present invention, field plate 40A is disconnected from source terminal 34A to form an isolated fifth (field plate) terminal. This fifth terminal can be used to sense drain voltage. Specifically, by disconnecting field plate 40A from source terminal 34A, a separate field plate terminal is formed. By measuring the voltage or current at the newly formed field plate terminal, the drain voltage of the resulting device can be sensed with a high degree of accuracy. This is due to, as will be further explained below, the monotonic relationship between current/voltage on the field plate terminal and drain voltage.

Figure 2:
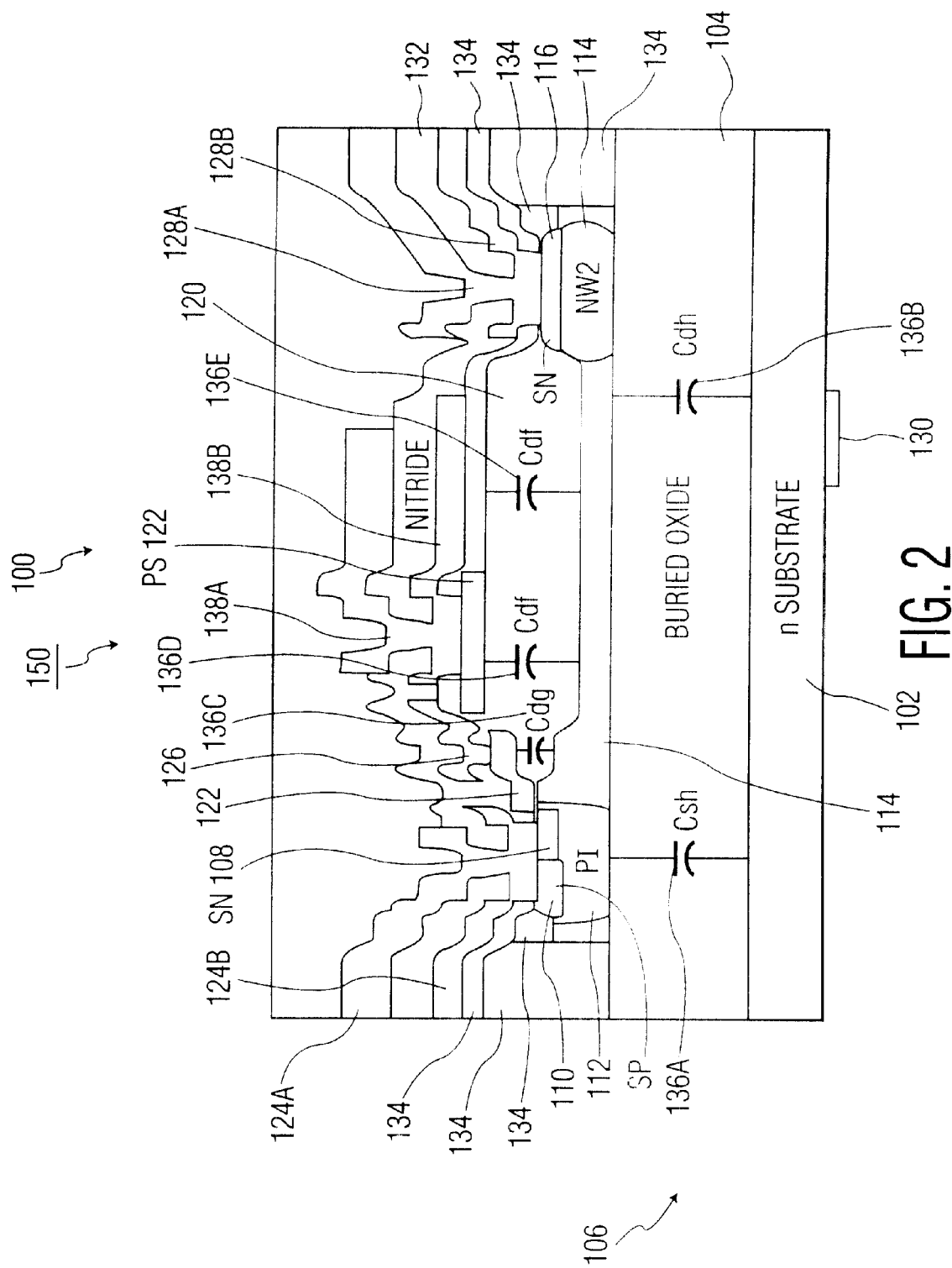
FIG. 2 depicts a cross-sectional view of a semiconductor device, according to the present invention.

Referring now to FIG. 2, a thin layer, high voltage, lateral SOI semiconductor device 100 according to the present invention is shown. Similar to device 10, device 100 includes: (1) substrate/handle wafer 102; (2) buried oxide layer 104; (3) silicon layer 106 having N+source region 108, P+source region 110, P-inversion or body region 112, drift region 114, n-well 2 region 114; and N+drain region 116; (4) top oxide layer 120; (5) polysilicon layers 122; (6) source terminal 124A–B; (7) gate terminal 126; (8) drain terminal 128A–B;(9) substrate terminal 130; (10) nitride layer 132; (11) oxide regions 134; (12) source to substrate capacitor 136A; (13) drain to substrate capacitor 136B; and (14) drain to gate capacitor 136C.

However, unlike any other device such as device 10 of FIG. 1, device 100 is provided with a field plate terminal 138A–B that is disconnected from all other terminals (e.g., source terminal 124A–B, gate terminal 126, drain terminal 128A–B, and substrate terminal 130). In addition, device 100 includes two drain to field plate capacitors 136D–E in lieu of two drain to source capacitors 48D–E (as shown in FIG. 1). This arrangement of a separate field plate terminal 138A–B and drain to field plate capacitors 136D–E allows device 100 to have a fifth terminal without adding additional components. This new field plate terminal 138A–B can be used to sense drain voltage to avoid overstress voltage conditions.

Specifically, a field plate, such as that shown in FIG. 1, is generally used in SOI devices to deplete the silicon to support high voltage. Moreover, high voltage capacitors are typically intrinsic to such devices. By making the field plate available as a terminal, and replacing the drain to source capacitors with drain to field plate capacitors, an existing device (e.g., device 10 of FIG. 1) can be modified to sense drain voltage. In previous embodiments, additional equipment such as an external high voltage capacitor was necessary. Such equipment, however, can add considerable expense to a device. The present invention modifies existing structure to sense drain voltage without adding additional components or cost.

As indicated above, drain voltage of device 100 can be sensed by measuring the voltage or current at field plate terminal 138A–B. Specifically, as known in the art, if the drain is put through a voltage swing, the capacitors 136A–E of device 100 will exhibit a displacement current flow to accommodate the change in voltage. Typically, the amount of current flow is a function of how large the capacitance is and how the capacitance varies with voltage. Thus, under the present invention, when a signal is placed on the drain, a displacement current flow on field plate terminal 138A–B will result. The change in current flow is in direct proportion to the amount of change in drain voltage. Thus, any change in drain voltage can be sensed and measured by measuring the voltage or current at the field plate terminal. For example, if device 100 is sourced into a high voltage switch, the drain voltage also will swing high. The voltage at field plate terminal 138A–B will track the drain voltage according to a mathematical relationship. This relationship can then be used as a decision, to make a change in the circuit if necessary. It should be understood that device 150 used to track voltage or current at field plate terminal 138A can be any such device known in the art and is not intended to be a limiting part of the present invention.

Figure 3:
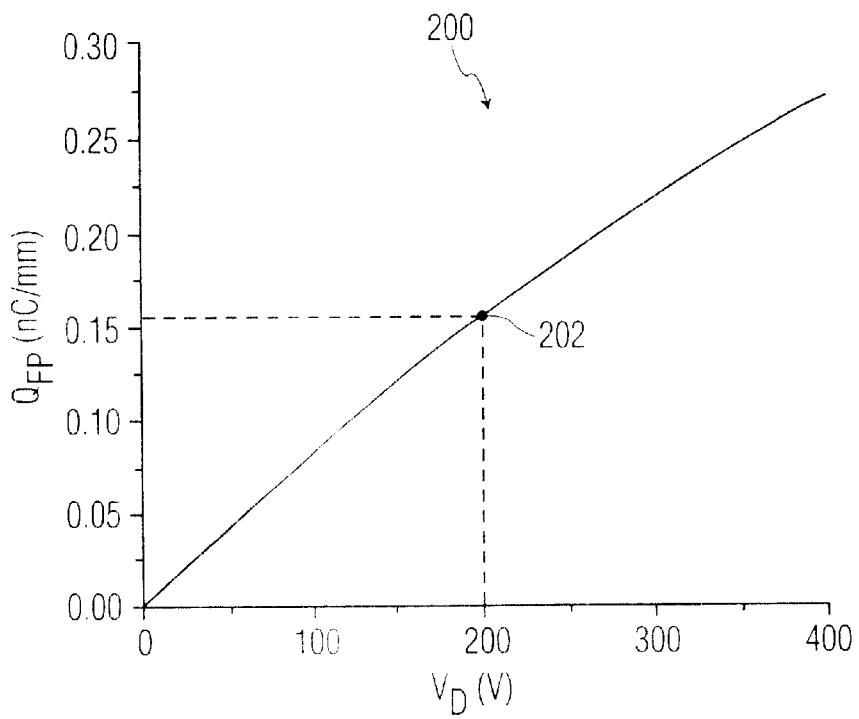
FIG. 3 depicts a graph of field plate charge (nC/mm) versus drain voltage (V).

FIG. 3 shows a graph 200 of the relationship between charge (nC/mm) supported by field plate terminal 138A–B versus applied drain voltage (V). The monotonic variation of charge with applied drain voltage shows that the potential on field plate terminal 138A–B will be a monotonic function of the applied drain voltage. This indicates that the displacement current through field plate terminal 138A–B will be a function of the drain voltage, and such a graph can be used for a calibration procedure of capacitance-to-voltage. For example, at point 202, a measured charge on field plate terminal 138A–B of approximately 0.155 nC/mm corresponds to an applied drain voltage of approximately 200V. This relationship can be used to accurately sense drain voltage to avoid overstress conditions.

Figure 4:
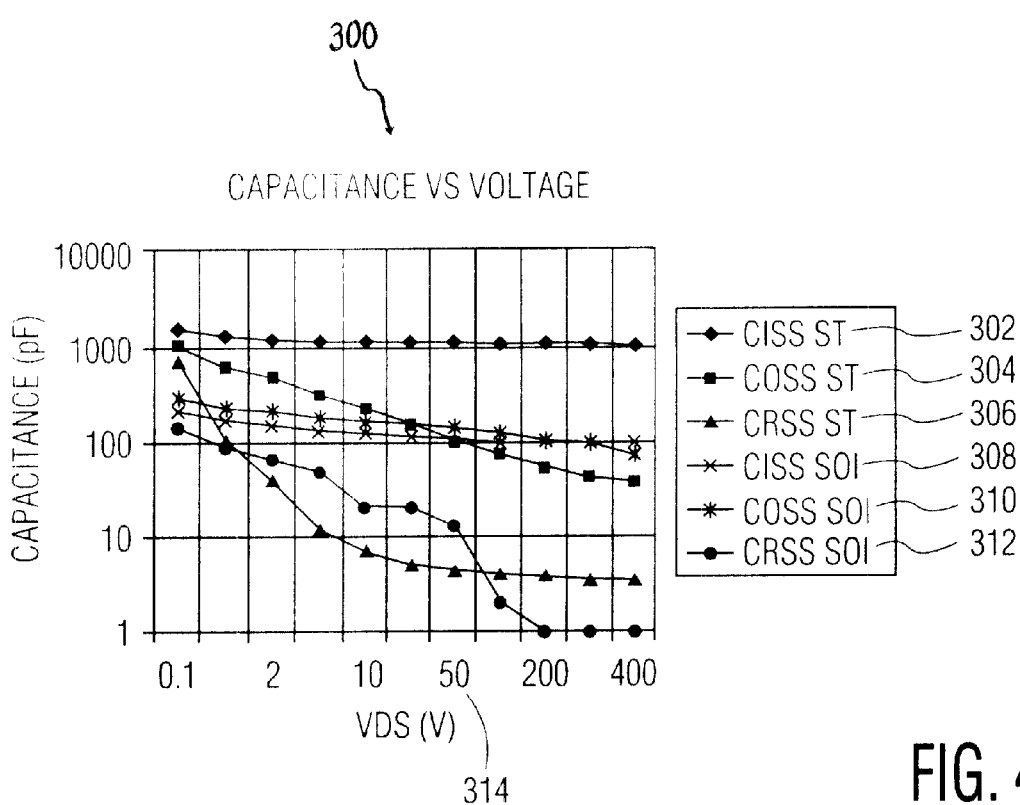
FIG. 4 depicts a graph of capacitance (pF) versus drain to source voltage (V) for vertical and lateral SOI power devices.

Referring now to FIG. 4, a graph 300 of capacitance (pF) versus drain to source voltage (V) for vertical and lateral SOI devices is shown. As depicted, graph 300 includes six plots. Plots 302, 304, and 306 relate to the capacitance for a vertical power device, while plots 308, 310, and 312 relate to capacitance for a lateral SOI power device. Specifically: (1) plot 302 relates to input capacitance for a vertical device; plot 304 relates to output capacitance for a vertical device; (3) plot 306 relates to reverse capacitance for a vertical device; (4) plot 308 relates to output capacitance for a lateral device; (5) plot 310 relates to input capacitance for a lateral device; and (6) plot 312 relates to reverse capacitance for a lateral device. The graph 300 shows that for a vertical device, at voltages in excess of 50V (point 314), the dependence of output capacitance for the SOI structure is higher than that of an equivalent vertical device. Taken in conjunction with the sense terminal of the present invention, this higher capacitance (Cdf) can be used for more accurate and sensitive voltage sensing. Accordingly, the present invention is effective in sensing/predicting (changes in) applied drain voltage for lateral SOI devices, such as those used in 500V and 800V SMPS for consumer goods (e.g., televisions, personal computers, etc.).

The foregoing description of the preferred embodiments of this invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of this invention as defined by the accompanying claims.

For example, it should be understood that other than having a separate field plate terminal 138A–B (i.e., a field plate that is disconnected from other terminals) with drain to field plate capacitors 136D–E, the precise structure of device 100 shown in FIG. 2 is not intended to be limiting. For example, device 100 could have multiple different thicknesses and/or arrangements of silicon layer 106, top oxide region 120, and/or oxide regions 136 such as those show in U.S. Pat. Nos. 5,969,387 and 6,221,737, both commonly assigned with the present application and herein incorporated by reference. Moreover, top oxide layer 30 could be shaped as shown in U.S. Pat. No. 5,246,870, commonly assigned with the present invention and herein incorporated by reference. Still yet, device 100 could have any doping profile(s) such as those described in U.S. Pat. Nos. 5,246,870, 5,300,448 and 6,232,636, all commonly assigned with the present application and herein incorporated by reference.

What is claimed is:

1. A lateral high voltage semiconductor device having a sense terminal, comprising:

a buried oxide layer formed over a substrate;

a silicon layer formed over the buried oxide layer;

a top oxide layer formed over the silicon layer; and a field plate terminal formed over the top oxide layer, wherein the field plate terminal is disconnected from a source terminal and a gate terminal to sense a drain voltage of the device.

2. The device of claim 1, further comprising a gate terminal formed over the top oxide layer, a drain terminal formed over the silicon layer, and a substrate terminal formed on the substrate.

3. The device of claim 1, wherein the field plate terminal is a high voltage capacitor.

4. The device of claim 1, wherein the drain voltage is sensed by measuring a field plate voltage during a switching transient.

5. The device of claim 1, wherein the device is a thin layer, high voltage, lateral silicon-on-insulator device.

6. The device of claim 1, further comprising a plurality of drain to field plate capacitors.

7. The device of claim 1, further comprising:

a source to substrate capacitor;

a drain to substrate capacitor; and a drain to gate capacitor.

8. The device of claim 1, wherein the field plate terminal is the sense terminal.

9. A lateral high voltage semiconductor device having a sense terminal, comprising:

a source terminal formed over a silicon layer;

a gate terminal formed over a top oxide layer;

a drain terminal formed over the silicon layer;

a substrate terminal formed on a substrate; and a field plate terminal formed over the top oxide layer, wherein the field plate terminal is disconnected from the source terminal to sense a drain voltage of the device.

10. The device of claim 9, wherein the device is a thin layer, high voltage, lateral silicon-on-insulator device.

11. The device of claim 9, wherein the drain voltage is sensed by measuring a field plate voltage during a switching transient.

12. The device of claim 9 further comprising a plurality of drain to field plate capacitors.

13. The device of claim 12, further comprising:

a source to substrate capacitor;

a drain to substrate capacitor; and a drain to gate capacitor.

14. The device of claim 9, wherein the field plate terminal is a high voltage capacitor.

15. The device of claim 9, wherein the field plate terminal is a sense terminal.

16. A method for forming a lateral high voltage semiconductor device having a sense terminal, comprising:

forming a buried oxide layer over a substrate;

forming a silicon layer over the buried oxide layer;

forming a top oxide layer over the silicon layer; and forming a field plate terminal over the top oxide layer, wherein the field plate terminal is disconnected from a source terminal and a gate terminal to sense a drain voltage of the device.

17. The method of claim 16, the forming step comprises:

forming a buried oxide layer over a substrate;

forming a silicon layer over the buried oxide layer;

forming a top oxide layer over the silicon layer; and forming a field plate terminal over the top oxide layer, wherein the field plate terminal is disconnected from a source terminal.

18. The method of claim 17, wherein the forming step further comprises:

forming a gate terminal over the top oxide layer;

forming a drain terminal over the silicon layer; and forming a substrate terminal on the substrate.

19. The method of claim 16, wherein the field plate terminal is a high voltage capacitor.

20. The method of claim 16, wherein the device is a thin layer, high voltage, lateral silicon-on-insulator device.

* * * * *